United States Patent [19]
Nordine

[11] Patent Number: 5,336,360
[45] Date of Patent: Aug. 9, 1994

[54] LASER ASSISTED FIBER GROWTH

[75] Inventor: Paul C. Nordine, Kansas City, Mo.

[73] Assignee: Clemson University, Clemson, S.C.

[21] Appl. No.: 835,292

[22] Filed: Feb. 13, 1992

Related U.S. Application Data

[60] Division of Ser. No. 515,665, Apr. 25, 1990, Pat. No. 5,126,200, which is a continuation of Ser. No. 78,316, Jul. 30, 1987, abandoned, which is a continuation-in-part of Ser. No. 897,710, Aug. 18, 1986, abandoned.

[51] Int. Cl.⁵ ............................................. C30B 25/00
[52] U.S. Cl. ..................................... 117/75; 423/276;
423/447.3; 117/929; 117/931; 117/951;
117/928; 117/952; 117/937; 117/936; 117/904
[58] Field of Search ............... 156/600, 610, 613, 614,
156/DIG. 80, DIG. 88, DIG. 97, DIG. 112;
423/276, 284, 294, 447.3

[56] References Cited

U.S. PATENT DOCUMENTS

| | | | |
|---|---|---|---|
| 3,226,248 | 12/1965 | Talley | 156/DIG. 80 |
| 3,811,917 | 5/1975 | Diefendorf | 423/289 |
| 3,944,640 | 3/1976 | Haggerty et al. | 264/25 |
| 3,976,444 | 8/1976 | Kuehl | 423/289 |
| 4,197,157 | 4/1980 | Haggerty | 156/620.71 |
| 4,308,078 | 12/1981 | Cook | 148/33 |
| 4,345,967 | 8/1982 | Cook | 156/613 |

Primary Examiner—Olik Chaudhuri
Assistant Examiner—Felisa Garrett
Attorney, Agent, or Firm—Dority & Manning

[57] ABSTRACT

A method of making pure fibers from a parent material utilizing laser energy. A short wavelength laser is used to achieve a diffraction limited focal spot diameter that is smaller than the diameter of the growing fiber. Focused laser beam convergence is used to obtain a fiber growth rate that depends on the fiber tip portion such that the fiber growth rate achieves a value equal to the controlled fiber pulling rate. The present invention achieves vapor-liquid-solid growth of single crystal silicon fibers and whiskers from silane gas and permits the use of other materials in the production of fibers by the vapor-liquid-solid process. The method provides an increase in the allowable ambient pressure and growth temperature and a large and more energy efficient growth velocity as compared to carbon dioxide based laser beam technology.

27 Claims, 6 Drawing Sheets

LASER ASSISTED FIBER GROWTH

This is a division of application Ser. No. 07/515,665 filed Apr. 25, 1990, now U.S. Pat. No. 5,126,200, which is a continuation application of U.S. Ser. No. 07/078,316, filed Jul. 30, 1987, which is a continuation-in-part application of U.S. Ser. No. 06/897,710, filed Aug. 18, 1986, both applications now abandoned.

FIELD OF THE INVENTION

The invention pertains to the use of laser energy to cause the pyrolytic formation of thin fibers from gaseous reactants. Materials which can be formed into small diameter fibers include high purity carbon, boron, silicon, silicon nitride, silicon carbide, and others.

DESCRIPTION OF RELATED TECHNOLOGY

The high tensile strength fibers of this invention can be used to reinforce ceramics, metallics and other materials and in other applications. Fiber strengthened composite materials can be used in fracture and oxidation resistant ceramics used at high temperature in high efficiency heat engines. Such strengthened materials can appear as part of fiber strengthened metals used in constructing lightweight structures and components in the aerospace environment. Composite materials employing boron filaments, for example, are used extensively in United States military aircraft, commercial aircraft, and on the space shuttle orbiter structure. Boron composites can be used in submarine hulls and propulsion components, stiffened golf shafts, tennis rackets and bicycle frames.

Similarly, strong reinforcing ribbon is needed to make composite materials that exhibit high strength in a direction perpendicular to the plane of the ribbon and parallel to the ribbon's longitudinal axis, thereby forming a composite material having high transverse strength. A silicon ribbon or sheet, for example, may be used in the manufacture of solar cells and integrated circuits.

The earliest vapor deposition processes involved the deposition of refractory compounds onto a heated filamentary substrate, thereby permitting the production of continuous fibers. A large number of materials which were otherwise not amenable to formation of fibers could be synthesized into filaments by this technique. Typically, substrate filaments of a material such as tungsten with a diameter ranging from 10 to 20 microns were electrically heated to a temperature at which a refractory material in the form of a volatile compound could be reduced or decomposed on the heated wire. A thick coating of 40 to 70 microns could be deposited on each filament in order to offset the high density contribution of the tungsten core. A boron fiber, for example, can be prepared by reducing boron trichloride in the presence of hydrogen to form a deposit of boron on the heated tungsten wire.

While vapor deposition involves the depositing of a material on an underlying core, the vapor-liquid-solid process involves the precipitation of material from a specially prepared atmosphere. In the traditional VLS process, the V represents a vapor feed gas or gas mixture, the L represents a liquid catalyst and the S represents a solid amorphous crystalline fiber product. The role of the liquid catalyst distinguishes the VLS method from other fiber growth techniques. The role of the catalyst is to form a liquid solution interface with the crystaline material to be grown and fed from the vapor through the liquid-vapor interface. The catalyst solution is a preferred site for deposition of feed material from the vapor which causes the liquid to become supersaturated. Crystal growth occurs by precipitation of the supersaturated liquid at the solid-liquid interface. In view of this mechanism, catalyst selection is partially based on the fact that the catalyst must display the affinity, when molten, to take into solution the constituent atoms of the fiber one wishes to grow.

In this mechanism, the role of the catalyst is to form a liquid alloy droplet of relatively low freezing temperature. For example, when growing a silicon crystal, the liquid droplet is a preferred site for deposition from the vapor, which causes the liquid to become supersaturated with silicon.

In addition to fibers, researchers have attempted to synthesize ribbons from a variety of materials. For example, V. Krukonis, as reported in "Chemical Vapor Deposition of Boron Filament" which appeared in the text *Boron and Refractory Borides* (V.I. Matkovich, editor) Springer-Verlag, New York, 1977, pp. 517–540, disclosed that attempts to grow strong boron ribbons by chemical vapor deposition on carbon substrates were not successful. The present invention permits the successful manufacture of boron ribbons.

Krukonis also reported on the manufacture by chemical vapor deposition of strong boron filaments using a mixture of gaseous boron trichloride/hydrogen deposited on existing tungsten filaments. The present invention eliminates the need for a tungsten core and allows production of boron fibers having a much smaller diameter than previously available. The elimination of the tungsten filament substrate upon which the prior art boron filaments are manufactured by means of chemical vapor deposition results in a homogeneous, boron fiber (composed entirely of boron), thereby eliminating the stresses necessarily induced at the interface of unlike substances.

R.S. Wagner and W.C. Ellis, in an article entitled "Vapor-Liquid-Solid Mechanism of Single Crystal Growth" (4 Applied Physics Letters pp. 89–90, 1964) disclose that single crystal silicon and silicon carbide fibers can be made by the vapor-liquid-solid process. In the prior art vapor-liquid-solid process, silicon containing gases (for silicon fiber growth), or silicon and carbon containing gases (for silicon carbide growth), decomposed to produce silicon, or silicon and carbon, dissolved in a liquid catalyst drop. A single crystal fiber grew from the liquid.

Similarly, vapor liquid solid growth in single crystals has been previously achieved, but only by the use of a catalyst which dissolves in and contaminates the solid crystals that are subsequently formed. The catalyst is consumed by dissolution in the solid and by evaporation. A major drawback of this method of fiber production is that the manufacturing process necessarily ceases if catalyst materials are not added to the liquid drop forming the fiber tip as fiber growth progresses.

In the past, researchers have discovered that rods of pyrolytic carbon could be made by heating materials with a focused carbon dioxide laser, as described by L. S. Nelson and N.L. Richardson in their article "Formation of Thin Rods of Pyrolytic Carbon by Heating with a Focused Carbon Dioxide Laser," *Materials Research Bulletin*, Volume 7, pp. 971–976 (1972). The Nelson and Richardson article taught that laser assisted rod growth velocity was very small, on the order of one inch (20 to 30 millimeters) per hour. The diameter of the resulting carbon fibers was in the range of 200 to 400 micrometers. As the laser power was increased, soot and other irregular material was deposited on the fiber. The resulting carbon rods possessed microstructure characteristics typical of low strength materials.

The present invention is concerned with improvements and extensions of fiber growth by vapor decomposition reactions, in which an external agent such as the catalyst drop or focused laser beam of prior art is used to produce a preferred direction of growth for material deposited by vapor decomposition reactions and thus form fibers whose axis is parallel to the preferred direction of growth. This invention includes (i) the use of a laser focal spot size that is much smaller than that of prior art, (ii) growth of smaller diameter fibers than are possible by prior art, (iii) fiber growth at higher ambient pressures and fiber tip temperatures than is possible by prior art, (iv) precise control of the fiber growth conditions to obtain high quality fibers that, e.g., are very pure single crystals as amorphous glasses and/or exhibit uniform and high values for the fiber's tensile fracture strength, (v) growth of high purity single crystals by the vapor-liquid-solid process in which a molten drop of the pure fiber material serves as the catalyst for fiber growth, (vi) control of fiber growth so that a single laser beam can be split and focused to many focal points at which fibers grow at the same rate even though the laser beam power is not precisely equal at each focal point, (vii) methods to initiate fiber growth from a substrate that do not require changes in the laser intensity during the initial stages of fiber growth, (viii) growth of very pure single crystal ribbons or sheets by means of the vapor-liquid-solid process, and (ix) fiber growth at the focus of a laser beam at rates such that the laser energy consumption per unit mass of fibers formed is more than 200 times smaller than that of prior art.

SUMMARY OF THE INVENTION

The present invention provides an apparatus and method for the manufacture of small diameter fibers, and thin ribbons, from a wide variety of materials. A short wavelength laser is used to achieve a diffraction-limited focal spot diameter that is smaller than the diameter of the growing fiber. Focused laser beam convergence is used to obtain a fiber growth rate that depends on the fiber tip position such that the fiber growth rate automatically achieves a value equal to the externally controlled fiber pulling rate. The different optical properties of solids and liquids are used to achieve temperature control at the melting point of the fiber or growth catalyst. Fibers composed of any solid material that can be deposited on surfaces by thermally assisted chemical vapor deposition may be grown.

The present invention achieves dramatic quantitative and qualitative improvements in previously known methods of laser assisted fiber growth such that fibers may be manufactured that have a diameter at least 20 times smaller, and growth velocities up to 100 times greater, which closely approach the diffusion limited fiber growth rate, while reducing laser energy consumption by a factor of 300. Inherently, fibers of the smallest possible diameter are desirable for use in composite materials. The resulting fibers are very strong, including the single crystal fibers. Fiber growth has been accomplished from the liquid state, and the growth of binary compound fibers has also been achieved.

The present invention achieves vapor-liquid-solid growth of single crystal silicon fibers and whiskers from silane gas and permits the use of other materials in the production of fibers by the vapor-liquid-solid process.

Other advantages of the present invention include an increase in the allowable ambient pressure and growth temperature and a larger and more energy efficient growth velocity as compared to carbon dioxide based laser beam technology.

The present invention allows the direct formation of silicon ribbon and sheet by reaction of silicon chlorides in hydrogen at the focal line of a laser beam that is formed by a cylindrical lens or by rapidly scanning the spot focus of a spherical lens over the desired ribbon width. This technique eliminates the necessity of an intermediate step for the formation of solid silicon. The present invention also eliminates contamination of the silicon by solid crucibles, dies, shapers, substrates, grids and other materials utilized by the prior art methods of growing silicon ribbon and sheets.

The present invention provides a method by which thin fibers and ribbons can be made from materials not previously available in that form. Amorphous, polycrystalline, and single crystal fibers can be produced. The new fibers and ribbons produced by the present invention may be used to achieve control of microstructure and crystallographic orientation of bulk materials. New bulk materials are thus made possible that have new and useful properties.

For example, strong magnets may be made from oriented magnetized fibers with diameters so small that the fibers contain only one magnetic domain. Another example is the production of bulk piezoelectric materials from oriented piezoelectric single crystal fibers. New kinds of composite materials can also be made, such as magnetic or piezoelectric composites in which unique properties are achieved by control of the concentration and orientation of the component fibers. New composite materials that exhibit unique combination properties such as high strength imparted by strong fibers and magnetic properties imparted by magnetic fibers are also made possible by this invention.

Ideally, a reinforcing fiber or ribbon should have the smallest possible diameter (along with the highest possible strength). Small fiber diameters can be achieved by using a laser having an emitted beam of the smallest possible wavelength. A small wavelength would generally have a value of less than 10.6 micrometers, and preferably less than 5.0 micrometers. The smallest wavelengths would approach 0.2 micrometers.

For the purpose of this invention, the term "continuous" when used in describing the fiber compositions of this invention will mean that the fiber has a length resulting from the continuous production of a fiber from the laser assisted fiber growth process and apparatus of this invention. The continuous fibers of this invention can be produced by initiating fiber growth and removing the fiber in a continuous process resulting in fiber of essentially arbitrary length.

The term "substrate free" when used in describing the fibers of this invention shall mean a fiber having a cross section consisting of the fiber materials and free of any substrate that can cause the deposition of fiber material. The use of the laser assisted fiber growth and method of this invention results in the production of fibers needing no substrate for a deposition.

DESCRIPTION OF THE PREFERRED EMBODIMENT

The apparatus described herein is used to achieve the growth of fibers by the laser assisted vapor-solid and vapor-liquid-solid fiber growth processes.

Laser and Reactor Apparatus

Figure 1:
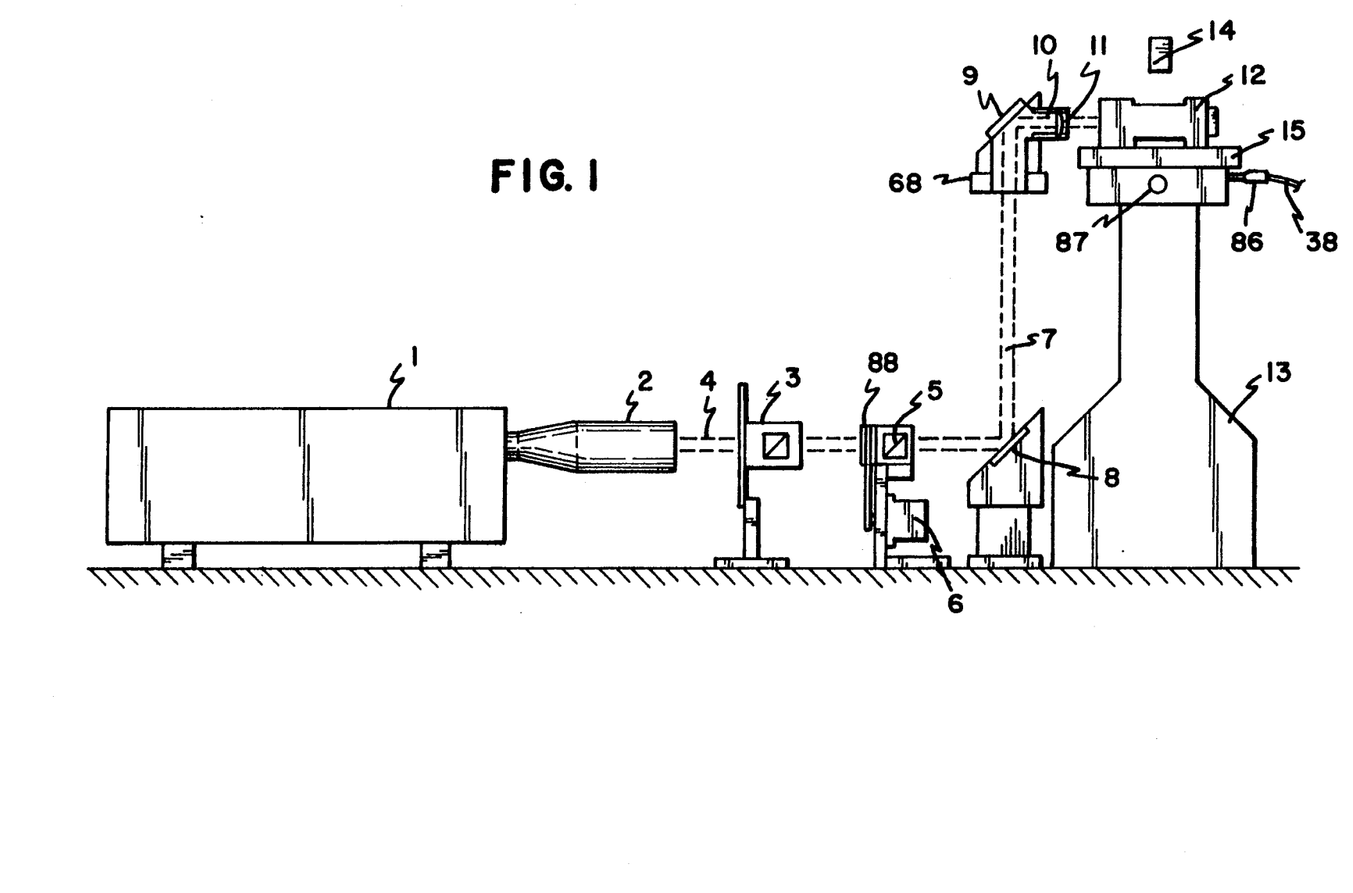
FIG. 1 shows a schematic diagram of a fiber growth apparatus constructed according to the present invention.
Figure 5:
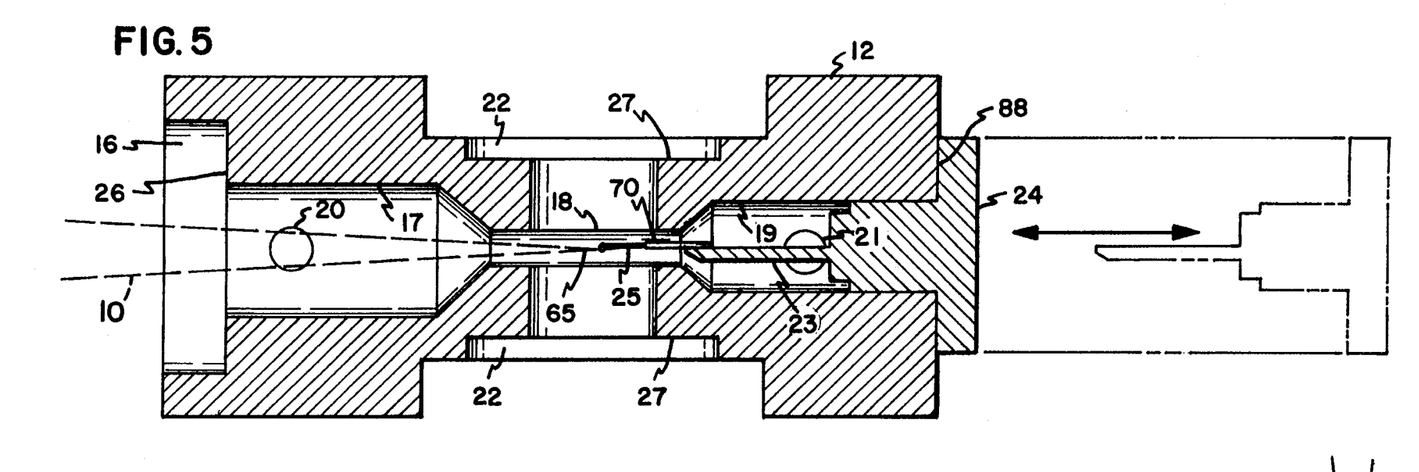
FIG. 5 is a sectional view of the reaction chamber as shown in the apparatus of FIG. 1.

An apparatus constructed according to the present invention is best viewed in FIGS. 1 and 5. A five watt multimode/one watt single mode continuous wave laser is shown generally at 1. Laser 1 is preferably of the neodymium-doped yttrium aluminum garnet type, or any of several other similar, short wavelength lasers. A beam expander capable of increasing the diameter of the beam by a factor of ten is shown at 2. When the beam expander is used in this configuration, the resulting beam has an approximate diameter of one centimeter. In order to make gross adjustments to the emitted beam, a manually rotated polarizing prism 3 is inserted into laser beam path 4. A halfwave plate 88 and fixed polarizing prism 5 are inserted into first beam path 4 following polarizing prism 3. The halfwave plate 88 may be adjusted electronically, for example by a computer, via stepper motor 6, which typically is capable of rotating the halfwave plate 88 so as to achieve one percent or smaller changes in the intensity of the beam transmitted by polarizing prism 5.

In order to deflect beam path 4, a magnesium fluoride coated, aluminum front surface mirror 8, typically having a diameter of two inches, is inserted into the beam path at an approximately 45 degree angle, thereby resulting in a second beam path 7. Second beam path 7 travels toward mirror 9, mirror 9 having a magnesium fluoride coated aluminum surface and being mounted at an approximately 45 degree angle to second beam path 7, thereby deflecting second beam path 7 approximately 90 degrees, resulting in a third beam path 10 which is parallel to first beam path 4. Third beam path 10 encounters lens 11, which has a diameter of approximately one inch and a focal length of approximately 10 centimeters.

As may be seen in FIG. 5, third beam path 10 continues to travel so as to ultimately reach reactor chamber 12, which is mounted on top of a suitable metallurgical microscope 13, such as manufactured by Reichert. A source of illumination 14 is mounted at a point approximately opposite to the microscope 13, thereby directing a beam of light through reactor chamber 12 and permitting viewing the interior of the reactor chamber 12 by microscope 13.

The reactor chamber 12 is mounted on microscope stage 15 which may be moved by means of micrometer drives 86 and 87. Micrometer drive 86 is connected by a suitable cable 38 to a stepping motor or similar device which interfaces with a computer to ultimately control the fiber pulling rate. Micrometer 87 can be manually operated to move microscope stage 15 and reactor 12 in a horizontal direction perpendicular to laser beam direction 10. Motion of microscope stage 15 and reactor 12 in a vertical direction perpendicular to the laser beam direction 10 is provided by a thumbwheel screw adjustment on microscope stage 15 and by the focusing mechanism of microscope 13.

The laser beam following path 10 is introduced into reactor chamber 12 via window 16. The interior of the reactor chamber 12 is separated into an entrance cavity 17, a central cavity 18 and an exit chamber 19. Pressurized gas is introduced into the inlet chamber 17 via reactant inlet 20. Pressurized gases are permitted to vent from outlet chamber 19 via reactant exit 21. Note that the sides 22 of the central cavity 18 are formed of a transparent material such that light from lamp 14 may pass through the central cavity 18 and reach microscope 13 thereby enabling viewing of the fiber growth process as it occurs within the reactor chamber 12. Support for the fiber residing within reactor chamber 12 is provided by fiber substrate support probe 23 which extends into exit cavity 19. Support probe 23 rests on probe base 24 which is inserted within reactor chamber 12 so as to seal exit cavity 19. Fiber substrate 70 is attached to fiber substrate support probe 23 and extends into the central cavity 18 such that an edge of the fiber substrate 70 is perpendicular to the direction of the laser beam path 10 and initially coincides with the laser focal point. Manually operated micrometer drive 87 allows the reactor 12 to be moved in a horizontal direction perpendicular to the direction of laser beam path 10 so the laser can be focused to any point on the edge of fiber substrate 70. The growing fiber 25 extends from fiber substrate 70 in central cavity 18, thereby coinciding with the focal point of beam path 10.

Microscope 13 is typically operated with a magnification of 70× to view a region that is 1.6 mm long in a direction parallel to laser beam direction 10 by 1.3 cm wide in a direction perpendicular to laser beam direction 10. The region inside reactor chamber 18 that is observable through transparent side walls 22 is 14 mm long by 2.8 nun wide. The edge of fiber substrate 70 on which fibers grow is typically located 1 to 2 mm inside the edge of this observable region. Reactor 12 is typically located on microscope stage 15 such that fiber substrate 70 is at the laser focal point when microscope stage 15 is within 1 mm of the limit of travel in a direction towards the laser focusing lens 11. Micrometer drive 86 allows microscope stage 15 to be moved a total distance of 15.9 mm in a direction parallel to laser beam direction 10. Typically, fibers can be grown to a total length of 15 mm at which point the microscope stage encounters its limit of travel in a direction away from laser focusing lens 11. This maximum fiber length is achieved by allowing the last 2 or 3 mm of fiber growth to occur in a section of reactant chamber 18 that is not observable with microscope 13.

Typically, an electronic manometer probe extends into central cavity 18 in order to measure pressures within the cavity. The reactor vessel 12 is typically made of steel, as is fiber substrate support probe 23. The fiber substrate 70 is typically made of paper. The edge of the paper, from which fibers are grown, is carbonized by heating in methane or ethylene with the focused laser beam. Laser window 16 is typically ⅜ inch thick glass, while the sides 22 of central chamber 18 are typically constructed of ¼ inch thick glass. In order to provide proper sealing, a first O-ring 26 is located at the interface between laser window 16 and outer cavity 17. Two O-rings 27 are located at the interfaces between windows 22 and central cavity 18. An O-ring 88 is also located between reactor vessel 12 and probe base 24. The reactant inlet 20 and reactant outlet 21 are typically ¼ inch in diameter.

Figure 4:
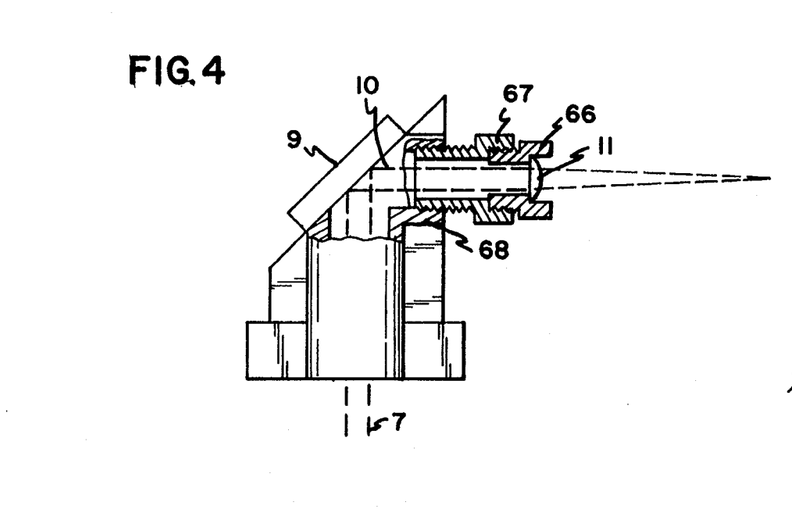
FIG. 4 is a sectional view of the mirror/focusing mechanism as shown in the apparatus of FIG. 1.

Another feature of the present invention may best be viewed with reference to FIG. 4, which shows the area of the apparatus surrounding mirror 9 and the deflection of the laser beam path 7 to form a new beam path 10. In order to observe fiber growth in microscope 13, the region of fiber growth 25 occurring within the reactor chamber 18 must appear in the area illuminated through transparent side walls 22. Since fiber growth only occurs near the focal point 65 of the laser beam focusing lens 11, some means must be provided to ensure that the focal point 65 resides near the center of the section of central cavity 18 that can be observed in microscope 13. This is best accomplished by mounting lens 11 in a threaded lens mount 66. A threaded focusing mount 67 serves as a support for lens mount 66 and permits the lens mount 66 to be moved in small increments as required to adjust the location of focal point 65. Threaded focusing mount 67 is itself permanently attached to the mirror and lens mount holder 68, which is a foundation not only for the threaded focusing mount 67, but which also ensures that mirror 9 is aligned at the proper angle to deflect laser beam 7 to new beam path 10.

Gas Delivery System

Figure 3:
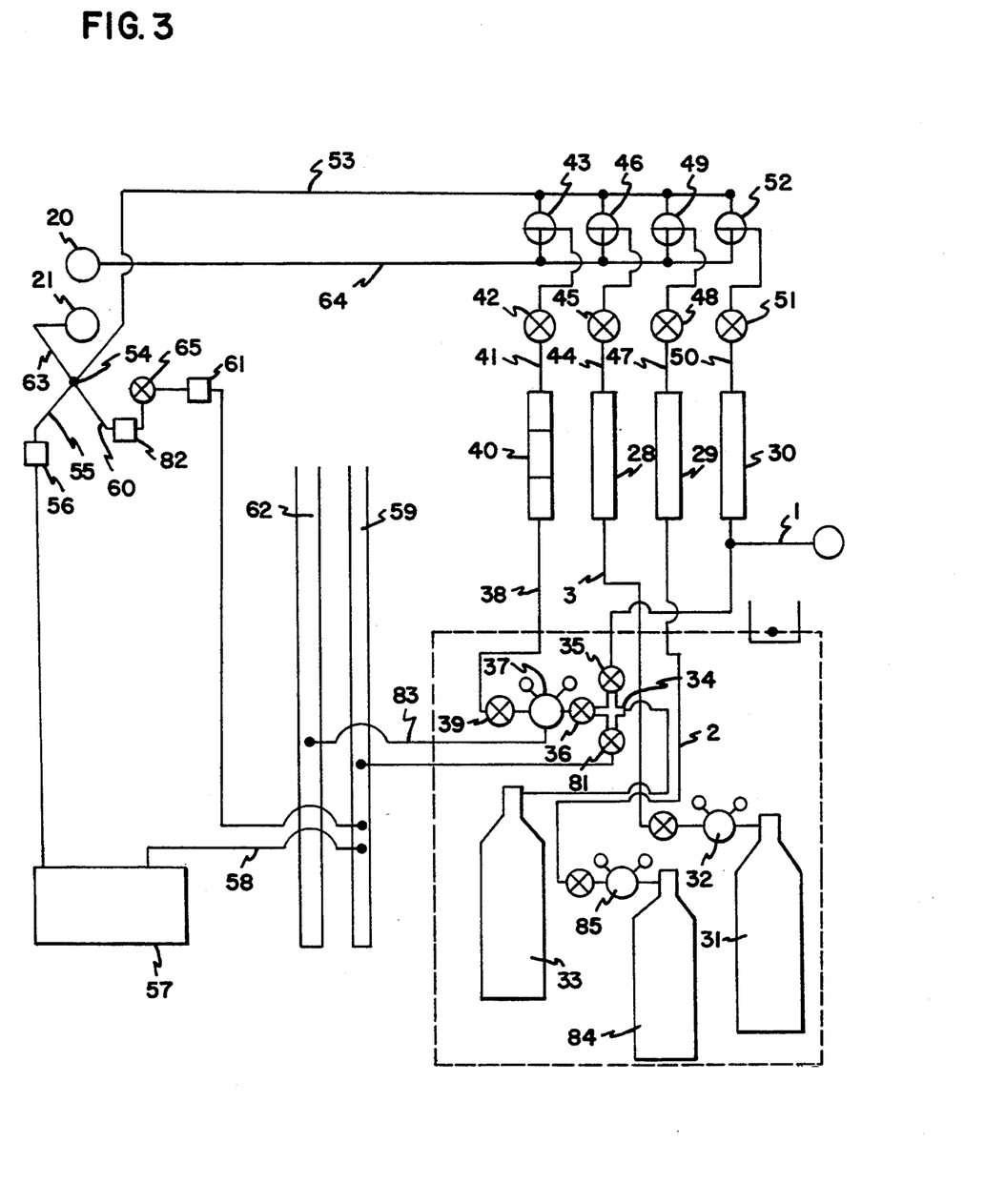
FIG. 3 is a schematic diagram of the fluid supply system as utilized by the apparatus cf FIG. 1.

Now referring to FIG. 3, the reactant chamber gas delivery system may be described. Argon supply line 1, ammonia supply line 2 and methane supply line 3 are all connected to separate rotameters 30, 29 and 28, respectively. Silane supply line 38 is connected to electronic flowmeter 40. Methane is supplied from tank 31, the pressure of the methane supplied being regulated by methane regulator 32. Ammonia is supplied from tank 84, the pressure of the ammonia being regulated by ammonia regulator 85. Silane is supplied from tank 33, the pressure of the silane supplied being regulated by silane regulator 37. Diborane may be supplied by substituting a tank of 40% diborane plus 60% hydrogen for silane tank 33. Ethylene may be supplied by substituting a tank of ethylene for methane tank 31.

Silane tank 33 is connected to cross purge assembly 34, the purge assembly having an inlet valve 35 which is connected to argon line 1. A first outlet valve 81 of purge assembly 34 is connected to exhaust pipe 59. A second outlet valve 36 of purge assembly 34 is connected to silane regulator 37. An outlet line 83 from the bonnet of silane regulator 37 to exhaust pipe 62 provides safe release of silane gas in case of a leak or breakage of the silane regulator diaphragm.

The silane path 38 leads from silane regulator 37 through valve 39, traveling to electronic flow meter 40. The output line 41 from electronic flow meter 40 leads to needle valve 42, which regulates the amount of silane reaching three-way ball valve 43. Similarly, the methane output line 44 leads from rotameter 28 to first metering valve 45 which controls the amount of methane reaching second three-way ball valve 46. Ammonia output line 47 leads from the ammonia rotameter 29 to a second metering valve 48 which controls the amount of ammonia reaching a third three-way ball valve 49. Finally, argon output line 50 leads from argon rotameter 30 to a third metering valve 51 which controls the amount ,Dr argon reaching a fourth three-way ball valve 52.

Each of the three-way ball valves 43, 46, 49 and 52 has one of its three ports connected to a common exhaust line 53, which leads to exhaust junction 54. A first path 55 emanating from exhaust junction 54 leads through a control valve 56 to a two-stage vacuum pump 57 having an approximate capacity of five cubic feet per minute. The pump exhaust line 58 leads from the pump 57 to an exhaust pipe 59 which is vented to the atmosphere or some other suitable depository. The second path 60 leading from exhaust junction 54 passes through filter 82, needle valve 65 and toggle valve 61 directly to exhaust pipe 59. A third path 63 emanating from exhaust junction 54 leads directly to exit orifice 21 of the reactant chamber 12.

The remaining port of three-way ball valves 43, 46, 49 and 52 are connected to a common reactant chamber input line 64 which leads directly to reactant chamber input port 20.

Reactant gas pressures and flow rates are controlled as follows. The gas supply line pressures are first set at values greater than the desired reactor pressure. For pressures greater than or equal to one atmosphere in reaction chamber 12 control valve 56 is closed and toggle valve 61 is opened. Then needle valves 65 and 42 and metering valves 45, 48 and 51 are adjusted to set pressure and reactant flow rates at the desired values. For pressures less than one atmosphere in reaction chamber 12 toggle valve 61 is closed. Then control valve 56, needle valve 42, and metering valves 45, 48 and 51 are adjusted to set pressure and reactant flow rates at the desired values.

Operation of the Fiber Growing Apparatus

The procedure followed in fiber growth experiments was typically as follows. The reactor was first evacuated. Then argon was swept through the reactor. Then methane or ethylene was swept through the reactor and the laser turned on and focused onto the edge fiber substrate 70 as demonstrated by the incandescent hot spot at the edge of fiber substrate 70 that could be observed through the microscope. The edge of fiber substrate 70 was carbonized by manually operating micrometer drive 87 to move the laser focal point along the edge of fiber substrate 70. Then the laser shutter was closed and the methane or ethylene was turned off, the reactor was evacuated and a small flow of argon was allowed to pass through the reactor via reactant input line 64. The reactant gases to be used were set to flow via exhaust line 53 to the vacuum pump 57 or, through filter 82, needle valve 65, and toggle valve 61, to exhaust pipe 59. The reactor pressure and reactant gas flow rates were set at the desired values as previously described. Laser power was set at the desired value as previously described. The computer operated fiber pulling rate was set but not initiated. Then the reactant gas flows were switched, with three way ball valves 43, 46 and/or 49, from exhaust line 53 to reactor input line 64, the argon flow was switched, with three way ball valve 52, from reactor input line 64 to exhaust line 53, and fiber growth was initiated by opening the laser shutter. Fiber pulling was started at the preselected rate when fiber growth began as observed through the microscope.

An alternative procedure to initiate fiber growth resulted if the fiber substrate 70 was moved to a position approximately 500 micrometers distant from the laser focal point before the laser shutter was opened to initiate fiber growth. Then, when the laser shutter was opened, fiber growth did not occur. But when the motion of the fiber substrate was started at the preselected rate, fiber growth would automatically occur when the substrate edge approached the laser focal point. It was not necessary to observe fiber growth in order to initiate fiber growth.

Measurement of Process and Fiber Properties

The growing fiber typically assumed a position relative to the laser focal point at which the fiber pulling rate and fiber growth rate were equal. The fiber growth conditions could be changed during an experiment to characterize the fiber growth process by measuring fiber diameter, fiber growth velocity, and fiber tip position relative to the laser focal point position, versus total pressure, reactant gas flow rate, reactant gas mixture composition, and laser power.

Fiber properties were determined subsequent to the fiber growth experiments by examination under a high power optical microscope, by examination with a scanning electron microscope, by measurement of the x-ray diffraction pattern of the fiber material, by preparing polished cross sections of the fiber and examining them under a metallurgical microscope and a scanning electron microscope, and by measuring fiber tensile fracture strength in an Instron testing device.

Selected conditions under which laser energy efficient growth of different fibers was obtained are given in the table below:

| Demonstrated Conditions For Laser Assisted Fiber Growth | | | | | |
| --- | --- | --- | --- | --- | --- |
| Material | Diameter d, um | Growth Velocity u, um/sec | ud um$^2$/sec | Laser Power mw | Laser Energy kWh/lb |
| Boron | 19.2 | 625 | 12,000 | 94 | 28 |
| Carbon | 63 | 331 | 20,900 | 350 | 12.5 |
| Silicon | 45 | 460 | 20,700 | 150 | 11.1 |
| Silicon carbide | 120 | 75 | 9,000 | 300 | 13.9 |
| Silicon nitride | 45 | 338 | 15,200 | 102 | 7.0 |

Examples of Laser Assisted Chemical Vapor Deposition Fiber Growth

Some examples and application areas for fibers that may be grown by the process of the present invention are given in the table below:

| Fiber Material | Gaseous Reactants | Material Type and Possible Applications |
| --- | --- | --- |
| Si | $SiCl_4$, $H_2$ | Semiconductors and |
| Ge | $GeH_4$ or $GeCl_4$, $H_2$ | IR transmitting fibers |
| ZnSe | $Zn(CH_3)_2$, $H_2Se$ | |
| CdTe | $Cd(CH_3)_2$, $H_2Te$ | |
| GaAs | $Ga(CH_3)_3$, $AsH_3$ | |
| W | $WF_6$, $H_2$ | Very pure metal fibers |
| Re | $ReF_6$, $H_2$ | |
| SiC | $SiCl_4$, $CH_4$ | Ceramics, amorphous, |
| $Si_3N_4$ | $SiCl_4$, $NH_3$ | low density reinforcing |
| $B_4C$ | $BCl_3$, $CH_4$ | fibers, nuclear |
| BN | $BCl_3$, $NH_3$ | materials |
| B | $BCl_3$, $H_2$ | |

General Operating Principles Laser Focusing

Figure 2:
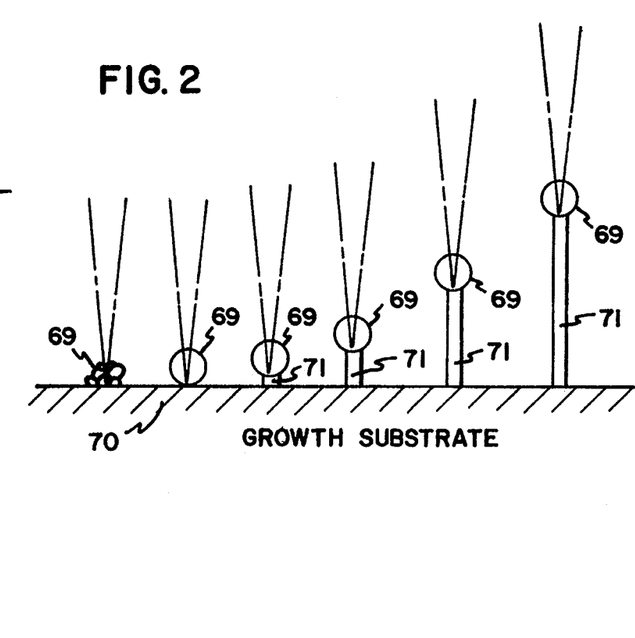
FIG. 2 is a schematic illustration of the growth of a crystal by vapor-liquid-solid deposition such as may be achieved by the apparatus of FIG. 1.

The present invention is based on the principle that a laser may be focused to a diffraction limited focal spot size that is proportional to the laser wavelength and the "F number" of the focusing lens. The wavelength of the emitted laser beam must be small in order to create a small focal spot. When focused on a substrate material 70, as shown in FIG. 2, the laser beam creates a region of dramatically elevated temperature, the area of the heated region corresponding to the focused beam spot size.

Gas Decomposition

Any gas or mixture of gases that is thermodynamically unstable towards decomposition or chemical reaction so as to form a liquid or a solid at high temperatures can be made to deposit material in the region of elevated temperature created by a focused laser beam. Ambient pressure and temperature conditions may be adjusted so that a fiber will grow at the focus of a laser beam as the focal spot is moved away from the substrate 70, the fiber 71 accreting as a result of the vapor deposition reaction.

The required and allowed fiber tip temperatures and ambient reactant pressures will depend on the kinetics of gas/surface reaction to deposit solid material, the kinetics of homogeneous gas reactions, the thermodynamic stability of the gaseous reactants, and the fiber diameter. The use of less stable reactant gases typically allows fiber growth at lower temperatures. For example, ethylene, which undergoes exothermic pyrolysis, decomposes to deposit carbon more rapidly than does methane, which undergoes endothermic pyrolysis. Maximum rate fiber growth, at the diffusion limited reactant supply rate, is thereby obtained at lower values of emitted laser beam power in the growth of carbon fibers from ethylene gas than from methane gas. Diborane is sufficiently unstable such that very rapid fiber growth occurs at a temperature low enough that the product fiber is amorphous, very flexible, and very strong.

The rate of gas/liquid reaction may be much greater than the rate of gas/solid reaction such that discontinuities occur in the growth rates of silicon, silicon carbide, and silicon nitride fibers at their melting points.

Growth of silicon carbide fibers differs from elemental fiber growth because silicon, silicon carbide, and/or carbon may be formed, depending on the reaction stoichiometry. The phases formed vary with rates of reactant decomposition at the fiber tip, which in turn depend on reactant concentration, laser power, total pressure, and the phase present (solid or liquid) at the fiber tip.

VLS Growth without Catalysts

The present invention achieves vapor-liquid-solid growth of, for example, single crystals silicon using pure liquid silicon as the growth initiating material, rather than utilizing a catalyst material as the liquid phase, and permits fibers to be produced from other materials with a molten fiber drop of the material only as the liquid phase. Use of the molten fiber material as the liquid phase eliminates contamination of the fibers by the catalyst, as is the result obtained by the traditional vapor-liquid-solid process, and, furthermore, allows fibers of any length to be grown.

VLS Growth with Catalysts

The present invention also achieves vapor-liquid-solid growth of, for example, single crystal silicon from a liquid catalyst drop. As best seen in FIG. 2, the catalyst 69 is placed on a suitable substrate 70. The resultant liquid alloy 69, containing silicon atoms and a suitable transition material such as platinum, palladium, or gold, is heated to its melting point and forms a liquid catalyst drop. Silicon atoms in the vapor feed are accreted onto the surface by the liquid catalyst, which soon becomes supersaturated, and solid silicon precipitates from the liquid catalyst onto the growth substrate. As precipitation continues, the fiber 71 grows, lifting the liquid catalyst drop 69 from the substrate 70 forming a fiber which is proportional in size to the catalyst ball. The fiber grows in length by this mechanism until the catalyst is consumed or until the growth conditions are changed.

Control of Catalyzed VLS Growth

The present invention allows the size of the liquid catalyst drop to be controlled in catalyzed vapor-liquid-solid growth of single crystal fibers. The method conceived is to supply catalyst atoms to the fiber tip by adding gaseous molecules that contain the catalyst atoms to the reactor feed gases. The catalyst-containing molecules may be chosen such that they undergo thermal decomposition at the fiber tip to deposit catalyst atoms, thereby controlling catalyst drop size by adding catalyst atoms in amounts equal to those lost by dissolution in the growing fiber, evaporation from the fiber tip and other loss processes that may occur.

Metal-Organic Chemical Vapor Deposition

The use of metal-organic chemical vapor deposition (MOCVD) to grow fibers is similar to hydride decomposition reactions. Most of these MOCVD reactions are exothermic, irreversible, and controlled by reaction kinetics. An example is ZnSe formation by reaction of dimethyl zinc with hydrogen selenide or dimethyl selenium:

$$Zn(CH_3)_2 + H_2Se = 2\ CH_4 + ZnSe$$

or $$Zn(CH_3)_2 + (CH_3)_2Se = ZnSe + 2\ C_2H_6$$

For such reactions, it is possible that the reaction can be carried out at high pressures and sufficiently low temperatures that amorphous materials are obtained.

Amorphous ZnSe, CdTe, and/or Ge-As-Se-Te glass are of special interest for their ability to transmit infrared radiation. The extreme purity with which glass can be made by chemical vapor deposition may allow fibers useful in $CO_2$ laser surgery and mid-ir fiber-optic communications to be obtained.

Metal Halide Chemical Vapor Deposition

In contrast to metal-organic chemical vapor deposition and hydride chemical vapor deposition reactions, metal halide chemical vapor deposition is usually endothermic. Reaction thermodynamics then needs to be considered in choosing the temperatures and pressures for fiber growth. In many cases, reaction kinetics will be very rapid at the thermodynamically required temperatures. Control over the temperature at which fibers grow may be obtained by the calculable effects of reactant pressure.

Growth of single crystal boron fibers from a gaseous mixture of boron trichloride and hydrogen is an example of endothermic fiber growth. Consider a stoichiometric gaseous mixture of 2 parts $BCl_3$ to 3 parts $H_2$, for which complete conversion to solid boron and gaseous hydrogen chloride would be described by:

$$2\ BCl_3 + 3\ H_2 = 2\ B + 6\ HCl$$

Thermodynamic data show that at a pressure of 3 atm, and 1500 K, about 4% of the $BCl_3$ reacts to form boron. At the melting point of boron, ca. 2300 K, conversion would be approximately 68%. Thus the extent of reaction increases with temperature such that boron would be deposited mainly at the fiber tip, to obtain a single crystal fiber if the tip is molten. The situation is quite different at a pressure of 1 atm. Conversion increases at 1500 K to about 25% and decreases at 2300 K to about 16% due to increasing formation of gaseous $BCl_2$ and $BCl$.

This example illustrates the importance of operating at higher pressures in fiber growth by endothermic reactions. Chemically frozen boundary layers occur at higher pressures for smaller diameter fibers to allow high pressure experiments without interference from smoke formation by homogeneous chemical reactions.

PROCESS THEORY

The rate of fiber growth and the diameter of the fiber that forms depend on the temperature, the physical state of the material at the fiber tip (solid, liquid or catalyst), the concentrations of reactant gases, the total pressure of reactant gases, the laser focal spot size, and the physicochemical properties of the fiber material, the reactant gases, and the chemical reactions by which the fiber forms.

Fiber Growth Rate

Figure 8:
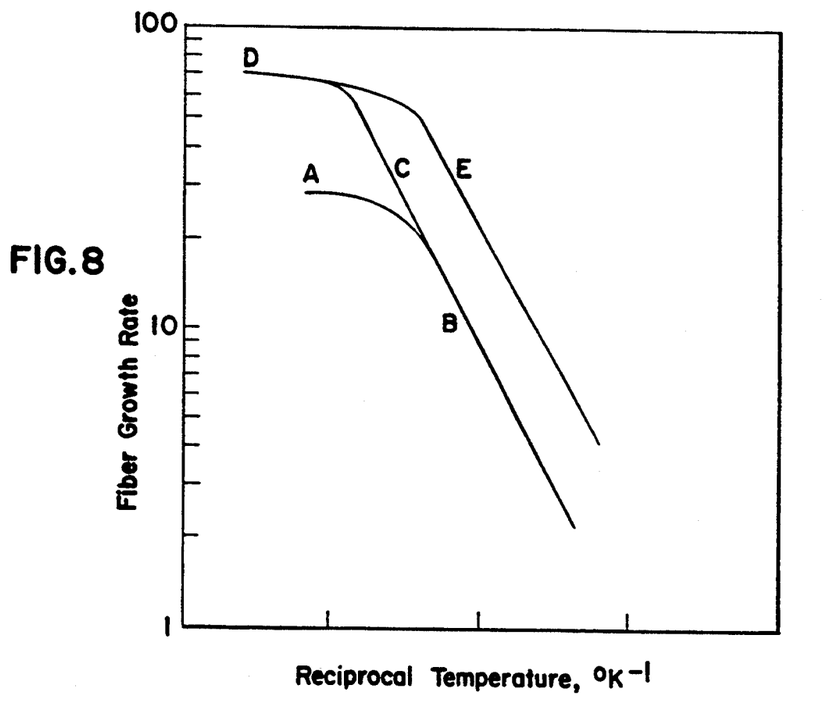
FIG. 8 is a graph illustrating the typical variation of fiber growth rate with fiber tip temperature, plotted as logarithm of rate versus reciprocal temperature. Curve A-B: larger diameter fiber at a low reactant pressure; Curve D-C-B: smaller diameter fiber at a low reactant pressure; Curve D-E: smaller diameter fiber at a high reactant pressure.

The fiber growth rate will typically vary with fiber tip temperature as shown in FIG. 8. At low temperatures the rate is small and controlled by the rate of gas decomposition on the fiber surface. The gas-surface rate limit typically displays a rapid increase with temperature. As the temperature is increased, a situation is reached in which the fiber growth rate is limited by reactant gas diffusion to the fiber tip, which displays a small variation with temperature.

The diffusion limited fiber growth rate is approximated by the equation $$u = [Nu_m \cdot (Dn)/d] \cdot v \quad (1)$$

where u is the fiber growth velocity, $Nu_m$ is the convective mass transfer coefficient, Dn is the product of the diffusivity, D, in $cm^2/s$ of reactant gas species and the molar concentration, n, in $moles/cm^3$ of reactant molecules in the gas fed to the reactor, and v is the volume in $cm^3$ of fiber formed from one mole of reactant. The diffusion limited value of u·d is typically $2 \times 10^{-4} cm^2/s$ and is approximately independent of reactant pressure and fiber diameter.

Fiber Temperature Gradient

Under the approximation that the gas and fiber thermal conductivities, $k_g$ and $k_f$, respectively, are independent of temperature, T, the axial temperature gradient at the fiber tip will be given by the equation:

$$dT/dz = 2[(T_t - T_a)/d]\sqrt{Nu_n\, k_g/k_f} \quad (2)$$

where z is axial distance in cm, dT/dz is the axial temperature gradient at the fiber tip in degrees Kelvin per cm, $T_t$ is the fiber tip temperature in degrees Kelvin, $T_a$ is the ambient temperature in degrees Kelvin, d is fiber diameter in cm, and $Nu_h$ is the transfer coefficient for convective energy loss from the fiber surface, whose value is on the order of 2. The units for fiber and gas thermal conductivity are watts per cm per degree Kelvin. Now consider growth of silicon fibers from silane gas as an example, with $T_t = 1680$ K, equal to the melting temperature of silicon, and $T_a = 300$ K. Appropriate thermal conductivities are $k_f = 0.25$ w/cm K and $k_g = 6 \times 10^{-4}$ w/cm·K. The temperature gradient at the fiber tip is thus seen to be large, on the order of 190,000 degrees Kelvin per cm for a 10 micrometer diameter fiber in this example. Stated differently, in the example, the fiber tip temperature decreases by about 190 degrees Kelvin in an axial distance equal to one fiber diameter from the fiber tip.

Laser Power

The heat flux from the fiber tip due to thermal conduction in the fiber, q'', in watts per unit cross sectional area of fiber, is given by the product of the axial temperature gradient and fiber thermal conductivity, i.e., $$q'' = k_f dT/dz \quad (3)$$

Because this heat flux is very large, e.g., 48,000 $w/cm^2$ for a 10 micrometer diameter silicon fiber in the example, other energy loss mechanisms can be typically neglected.

The laser power, q, required for growth of a single fiber is obtained by multiplying q'' by the fiber cross sectional area, substituting dT/dz from Equation (2) in Equation (3), and dividing by the fiber material's absorption coefficient, a, for laser radiation:

$$q = 0.5\pi d(T_t - T_a)\frac{\sqrt{Nu_h\, k_g\, k_f}}{a} \quad (4)$$

Thus, laser power increases linearly with fiber diameter. If the absorption coefficient for laser radiation were unity, the laser power required to grow a 10 micrometer diameter silicon fiber at the melting point of silicon would equal approximately 38 milliwatts.

Minimum Laser Energy for Fiber Growth

The preceding equations show that the product q''·d is approximately independent of fiber diameter as is the product u·d for diffusion limited fiber growth. q'' is also approximately independent of pressure. The ratio, q''/u is then approximately independent of fiber diameter and ambient pressure and, in the example of silicon fiber growth from silane, equal to $2.4 \times 10^5$ $j/cm^3$ if the absorption coefficient for laser radiation were unity. That is, $2.4 \times 10^5$ joules of laser energy absorbed by the fiber tip will produce a volume of fibers equal to one $cm^3$. This is equivalent to 13 kilowatt hours per pound of silicon. Thus the minimum energy consumption for fiber growth is typically in the range 5 – 50 kilowatt hours per pound.

Fiber Diameter

The diameter achieved by the growing fibers is determined by the diffraction limited laser focal spot size, the axial rates of fiber growth at the fiber tip temperature, and by the amount of radial growth of fiber in the region near the fiber tip where the temperature remains sufficient that significant radial growth is possible. Referring particularly to FIG. 8, it can be seen that the rate of growth varies slowly with temperature when the temperature is sufficient that diffusion limited growth occurs. Then fiber diameters substantially larger than the diffraction limited laser focal spot size are obtained. In the temperature regime where fiber growth is controlled by the kinetics of gas/surface reaction, fiber diameters approximately equal to the diffraction limited laser focal spot size may be formed.

Effect of Diameter on Smoke Formation

Small diameter fibers permit very rapid growth rates because the thickness of the boundary layer through which the reactants must diffuse increases with fiber diameter, the diffusion rate decreasing with boundary layer thickness. However, as shown by the differences between curve A-B and curve D-C-B in FIG. 8, the fiber tip temperature required to achieve diffusion limited growth typically increases as the fiber diameter decreases.

In order to prevent smoke formation initiated by the homogeneous decomposition of reactant gases in the heated boundary layer that surrounds the growing fiber, the fiber tip temperature must be limited so that the time required for significant homogeneous reactant gas decomposition to occur is large relative to the time required for the reactant gases to diffuse through the boundary layer. The diffusion time, $t_D$ is expressed by the equation $$t_D = x^2 p/D_o \quad (5)$$

where x is boundary layer thickness, p is the ambient pressure, and $D_O$ is the diffusion coefficient at a standard pressure of one atmosphere, which increases with temperature. The time, $t_h$, required for significant homogeneous reactant gas decomposition is inversely proportional to the ambient pressure:

$$t_h = K(T)/p \quad (6)$$

where K(T) depends on fiber tip temperature. The boundary layer thickness at the fiber tip is on the order of the fiber diameter. We thus obtain the following approximate constraint on conditions under which smoke will not form:

$$K(T) \cdot D_o \gtrsim (d\,p)^2 \qquad (7)$$

The value of $K(T)\,D_o$ decreases with temperature. Therefore the fiber tip temperature at which smoke forms increases when the fiber diameter decreases. This produces a large increase in the rate of gas/surface reaction, which typically varies rapidly with temperature, as illustrated in FIG. 8.

Thus, a novel aspect of the present invention is that the use of a small laser wavelength allows growth of sufficiently small diameter fibers such that efficient, diffusion limited growth can be achieved while simultaneously avoiding the formation of smoke.

Optimum Pressure for Fiber Growth

If the fiber diameter is small enough that smoke is not formed under conditions for diffusion limited growth it becomes possible to increase the reactant pressure. The fiber tip temperature and laser beam power necessary to achieve diffusion limited, maximum rate growth decrease as the reactant pressure increases, which is illustrated by the differences between curve D-C-B and curve D-E in FIG. 8. The increase in the gas surface reaction rate and the decrease in the temperature required for diffusion limited growth can be much larger than expected from the normal linear increase in rate with reactant pressure. This novel result is due to the increased internal energy of reactant molecules produced by an increase with pressure in the time required to diffuse through the boundary layer. The gas/surface reaction rates increase with the internal energy of reactant molecules. For a given fiber diameter, smokefree maximum rate diffusion limited fiber growth is obtained at a minimum fiber tip temperature when the pressure is just below the value at which smoke forms.

Temperature Control at the Melting Point

One novel aspect of the present invention is the fact that the heating of the fiber tip 69 by means of a laser beam provides an intrinsic mechanism for control of the growth of the solid fiber 71, either from the liquid state or from a thin layer of liquid catalyst at the fiber tip. The portion of the emitted laser beam flux that is absorbed at the fiber tip 69 depends on the physical state of the material at the fiber tip 69. When the material at the tip melts, the reflectivity changes. If the reflectivity of the material increases when the material enters its liquid state, automatic temperature control at the melting point will occur because a larger laser intensity will be required to maintain an existing molten fiber tip in its molten state than to initially bring a solid fiber tip to its melting point. By controlling the temperature to correspond to the melting point of the material or the catalyst that coats the fiber tip, high quality solid fiber crystals may be grown from the liquid state.

Control of the Fiber Growth Rate

Referring particularly to FIG. 8, it can be seen that the fiber growth rate typically increases rapidly with temperature when it is controlled by the kinetics of gas/surface reaction. The laser intensity, and therefore, the fiber tip temperature varies with position relative to the laser focal point. Thus, one novel aspect of the present invention is the automatic matching of the fiber pulling and growth rate occurring on the side of the laser focal point near the focusing lens. A continuous fiber may be grown by moving ("pulling") the growing fiber if the position of the fiber tip can be maintained to reside in the region where the laser beam is converging to a focal point. If the fiber growth rate exceeds the "pulling" rate, the fiber will grow into a region where the laser spot size is larger and the growth rates smaller, thereby matching the pulling rate. If the pulling rate were to exceed the growth rate, the fiber would be pulled into a region where the laser spot size was smaller, thereby increasing growth rate to match the increasing pulling rate. As a result of this intrinsic mechanism for control of the fiber growth rate, the axial position of the tip of the growing fiber changes to maintain a nearly constant fiber tip temperature if the laser power varies. This makes it possible to grow fibers that have very uniform and reproducible properties, e.g., ± 4% in the tensile strength of boron fibers grown in a single experiment.

Novel Methods

Referring now particularly to FIGS. 1 and 5, an apparatus according to the present invention is shown which permits exploitation of the novel fiber growth characteristics described. Suitable reactant gases are introduced to the apparatus through the system shown in FIG. 3. The reactant gases enter through entrance 20 and exit through orifice 21. The focused laser beam, as shown particularly at FIG. 4, is focused such that the focal point coincides with a point within central cavity 18 of reaction chamber 12.

Carbonized Paper Substrate

A substrate or base material 70 is affixed to fiber support probe 23 such that the substrate resides within central cavity 18, the surface of the substrate coinciding with the focal point of the laser beam. Another novel aspect of the present invention is that the substrate used may be composed of paper, which may be carbonized by heating in hydrocarbon gases such as methane or ethylene to produce a substrate with thermal conductivity so small that fiber growth can be initiated at the same laser power used for sustained fiber growth. By developing a substrate with these thermal conductivity characteristics, there is no need for special control equipment and procedures which would otherwise be required to rapidly change laser power and fiber pulling rate when fiber growth is initiated. If a substrate having a high thermal conductivity is used, the micrometer drive 86 would be used to control the fiber pulling rate at the moment of initiating fiber growth in order to compensate for the excess energy used to initially heat the substrate. The quantity of heat used to initiate growth would be quite unnecessary to maintain fiber growth, thus requiring a corresponding and simultaneous decrease in emitted laser power immediately following the initiation of fiber growth.

Continuous Fiber Production

Once fiber growth begins, fiber support probe 23 is moved away from the focal point along the line corresponding to the longitudinal axis of laser beam path 10. If a fiber having a relatively short length were desired, the substrate may be fixed inside the chamber 12 and the focal spot moved away from the substrate until the desired length is achieved. The fiber could then be broken from the substrate and the process repeated.

If a continuous fiber of indefinite length were desired, the growing fiber can be withdrawn from the chamber 12 through a suitable orifice in support plate block 24, for example, and the fiber can be withdrawn from the chamber 12 at the same rate at which the fiber is growing within the chamber 12, when the separate take-up spool is utilized, the reactor 12 can be mounted so as to be stationary, and the fiber is placed on the spool as it leaves the chamber.

Finally, if a laser is employed having a sufficiently small wavelength and a Lens 11 is utilized having a sufficiently large "F number", the length and diameter of the laser focal region would coincide with the length and diameter of the desired fibers. In such a case, the fibers could be broken from the substrate immediately upon their accretion within the chamber, thereby eliminating any need to move the lens, substrate support mechanism, or focal spot.

Multiple Fiber Production

A novel application of the present invention is the growth of a large number of fibers at identical rates from a single substrate in a single fiber growth chamber. This may be done by splitting a single laser beam into many beams that are separately focused to the growing fiber tips. The use of a carbonized paper substrate allows growth of the many fibers to be initiated by simply pulling the substrate so that it passes through the region to which the laser beams are focused.

The individual fibers would automatically achieve a growth rate equal to the pulling rate at axial positions relative to the individual laser focal points that vary with the laser intensity and ambient conditions at each fiber.

Ribbon Growth

Another novel aspect of the present invention is the ability to achieve laser assisted ribbon growth. The use of a cylindrical lens will permit the laser beam to be focused to a thin line, rather than a small spot, thereby causing growth to occur along a line defined by the focal region of the cylindrical lens. Alternatively, the laser beam may be focused to a small spot, as is the case with fiber growth, by use of a spherical lens. In that case, the spot may be swept back and forth rapidly over a distance equal to the desired ribbon width. A cylindrical lens would typically produce an intensity that varies along the focal line. The edge of the ribbon would then grow at a smoothly variable distance from the focal line such that the ribbon edge advanced at a uniform rate. In addition, a series of lens could be utilized to produce a gaussian beam to permit ribbon growth to occur.

Solid Liquid Solid (SLS) Fiber Growth

Novel aspects of the present invention make possible the growth of single crystal fibers from a solid powder feed. The method is to replace the reactant gas stream with an inert gas stream that carries small solid particles of the material of interest to a laser heated liquid fiber tip. Particles that impinge on the liquid fiber tip would stick and melt to provide the molten material from which the single crystal fiber grows. Particles that impinge on the solid fiber wall would not contribute to the single crystal fiber growth.

EXAMPLES

The following experimental results are typical examples of the new fibrous materials being produced with the laser assisted fiber growth apparatus and also illustrate novel aspects of the laser assisted fiber growth process. The numerical values reported for fiber diameter, laser power consumption, growth velocity, tensile strength, ambient pressure and other product or process parameters are experimentally obtained values that should not be construed as limiting values.

EXAMPLE 1

Carbon fibers have been grown from methane with fiber diameters in the range of 20 to 170 micrometers. The fiber growth velocities have varied between 9 micrometers per second to 330 micrometers per second. The ambient pressures existing within the reactant chamber were varied between 3.7 and 7.1 atmospheres. The product of the fiber growth velocity (U) and fiber diameter (D) has been as large as 21,000 micrometers squared per second, with laser energy consumptions as small as 36 kilowatt hours per pound of carbon.

EXAMPLE 2

Carbon fibers have been grown from ethylene with fiber diameters ranging from 10 to approximately 40 micrometers. The highest fiber growth velocities have been approximately 125 micrometers per second, achieved at ambient pressures within the reaction chamber of between 0.6 and 3.5 atmospheres.

EXAMPLE 3

Silicon fibers have been grown from silane. Fiber diameters have ranged from 29 to 93 micrometers. The fiber growth velocity has ranged from between 12 and 500 micrometers per second, at ambient pressures of between 0.35 and 3.4 atmospheres. The values of (U)·(D) have been on the order of 36,000 micrometers squared per second in conjunction with laser energy consumption as low as 11 kilowatt hours per pound. If the emitted laser power is sufficient to maintain a molten fiber tip, single crystal silicon fibers are obtained. Otherwise, polycrystalline fibers are produced. Liquid-tipped silicon fibers grew about ten times faster than did solid silicon fibers at temperatures just below the melting point of silicon.

Single crystal silicon fibers were also obtained by Pd, Pt, and Au catalyzed fiber growth, from the edge of thin Pd, Pt, and Au wire or sheet substrates. The growth axis for Pd-catalyzed crystals was parallel to the (320) crystallographic direction. In metal catalyzed growth, a mass of whiskers formed near the metal edge, from which the silicon fiber emerged. Whiskers continued to form at the edges of the fiber until the liquid metal at its tip was exhausted. Then fiber growth continued in a manner characteristic of the uncatalyzed process.

EXAMPLE 4

Silicon carbide fibers have been grown from silane-/ethylene mixtures, resulting in fiber diameters of between 13 and 136 micrometers. The fiber growth velocities have ranged between 6 and 120 micrometers per second at ambient reactant chamber pressures of approximately 0.4 atmosphere. The resultant polycrystalline silicon carbide fibers were characterized by high density and hardness.

Silicon carbide fibers were grown at a pressure of 1.2 atm and various silane:ethylene ratios. X-ray diffraction experiments showed alpha and/or beta SiC to be the major constituent of one specimen fiber.

Experiments were also carried out at a pressure of 0.4 atm and various flow rates and values of the laser power. X-ray diffraction experiments were used to identify the crystalline phases that were present. Process and XRD results are as follows:

| Process Data And Phases Formed In Fibers Grown From Silane and Ethylene | | | | | |
|---|---|---|---|---|---|
| Flowmeters | | Laser Intensity | Fiber Velocity | Fiber Diam | Phases observed |
| $SiH_2$ | $C_2H_4$ | mw | um/s | um | by XRD |
| 25 | 17 | 300 | 75 | 114–136 | Polycrystalline Si |
| 25 | 17 | 220 | 75 | 107–114 | " |
| 25 | 17 | 140 | 26 | 67 | " |
| 26 | 20 | 106 | 81 | 53 | " |
| 26 | 20 | 70 | 20 | 30 | None (XRD amorphous) |

EXAMPLE 5

Amorphous boron fibers have been grown from a gaseous mixture composed of 40% diborane and 60% hydrogen at temperatures in the range of 1000 to 1500 K. Homogeneous decomposition of diborane did not occur in these experiments. However, boron-smoke formed when the laser power was increased to attempt single crystal boron fiber growth at the melting point of boron (ca. 2300 K). The resultant fiber diameters ranged from between 9 and 100 micrometers.

Figure 6:
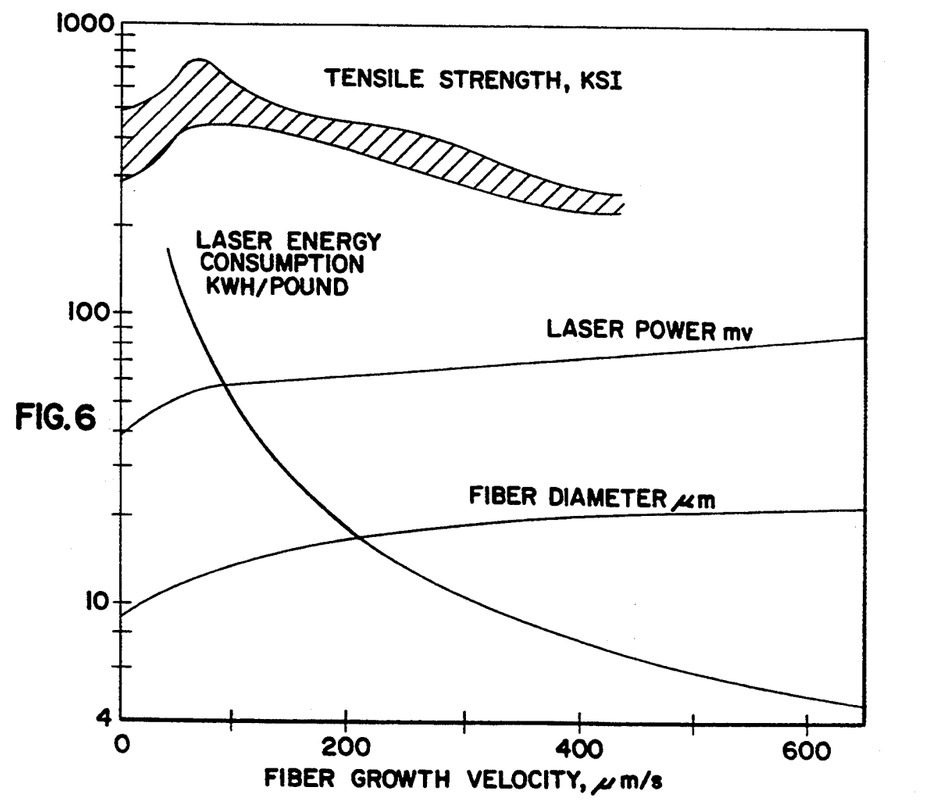
FIG. 6 is a graph illustrating the boron fiber/growth characteristics as produced by the apparatus of FIG. 1.
Figure 7:
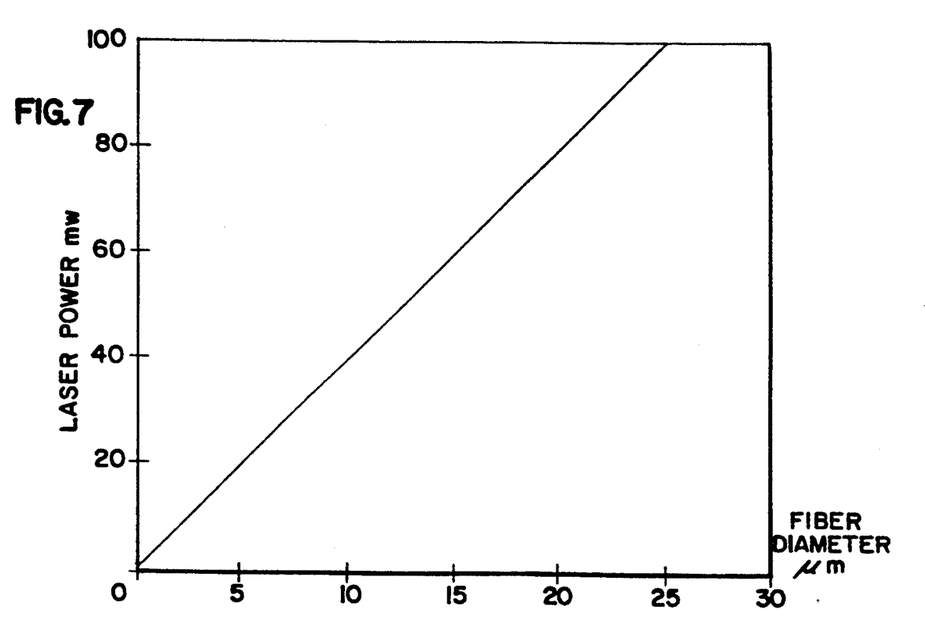
FIG. 7 is a graph illustrating the relationship between the laser power utilized and the resultant fiber diameter when using the apparatus of FIG. 1 to grow boron fibers.

The fiber growth velocities ranged from between 6 and 700 micrometers per second at ambient reactant chamber pressures of between 0.4 and 2.7 atmospheres. The largest values of (U)·(D) were on the order of 22,000 micrometers squared per second with laser energy consumptions as low as 10 kilowatt hours per pound. The boron fibers produced which had a diameter of less than approximately 22 micrometers, which were grown at a fiber growth velocity of less than 450 micrometers per second and a laser power of less than 80 milliwatts, were amorphous, very flexible, and exhibited high tensile strength, on the order of 250,000 to 750,000 psi. More particularly, boron fibers have been grown having a diameter of 14.2 micrometers, which was achieved at a laser power of 74 milliwatts and at a growth velocity of 100 micrometers per second. The tensile strength of these fibers was typically 515,000 psi plus or minus 17,000 psi. FIG. 6 presents boron fiber process and property data. Tensile strengths were as large as 750 KSI and fiber growth velocities up to 625 um/sec were achieved. FIG. 7 illustrates the relationship between the laser power utilized and the resultant fiber diameter when using the apparatus of FIG. 1 to grow boron fibers.

Figure 10:
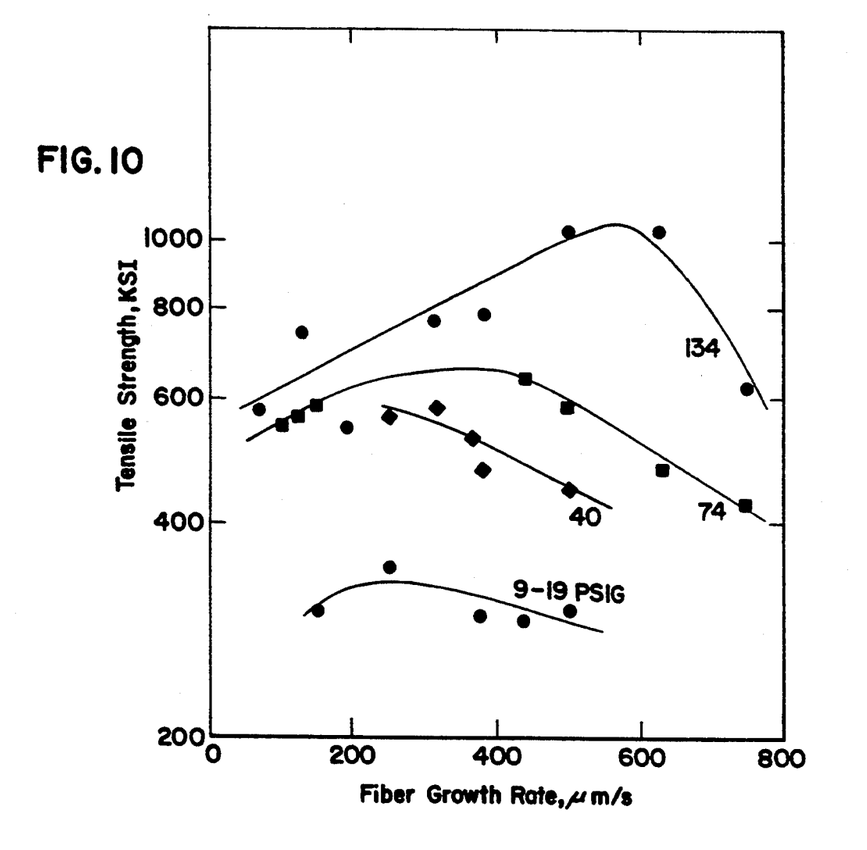
FIG. 10 is a graph illustrating boron fiber strength versus growth velocity.
Figure 11:
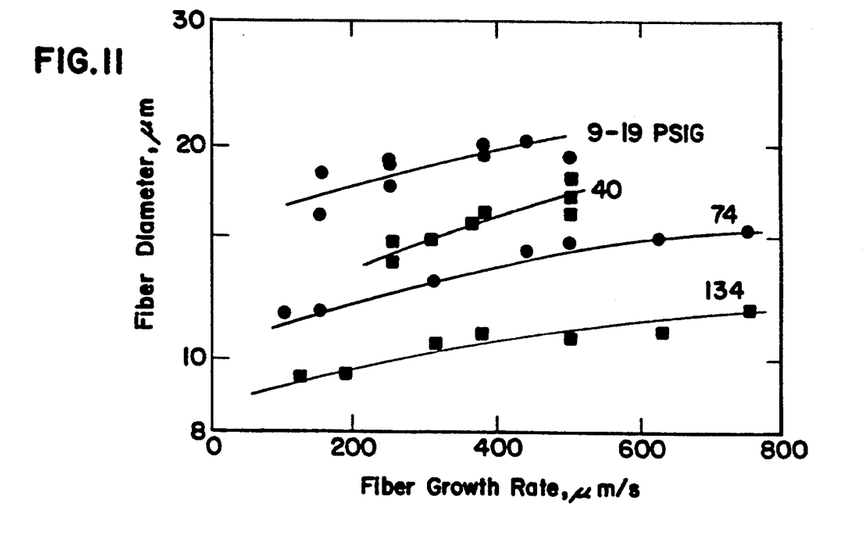
FIG. 11 is a graph illustrating minimum boron fiber diameter versus growth velocity for fibers grown at different reactant pressures.

FIG. 10 presents further tensile strength data for fibers grown at reactor pressures between 9 – 134 psig. The fiber strength is seen to increase with reactant pressure at a constant growth rate and achieve $10^6$ psi for fibers grown at the highest pressures. FIG. 11 presents diameter measurements on the fibers for which tensile test data of FIG. 11 were obtained.

The maximum pressure at which fibers could be grown was determined by the appearance of smoke in the reactor due to homogeneous diborane decomposition. This occurred when the product of fiber diameter and reactor pressure exceeded approximately 120 um·atm, i.e., at approximately 10 atm pressure for 12 um diameter fibers. Growth of smaller diameter fibers at larger pressures would be possible if a smaller F No. laser focusing lens were used to reduce the laser focal spot size.

Preliminary stress versus elongation data were obtained on relatively low tensile strength fibers grown at a rate of 100 um/s and at a reactant pressure of 12 psig. The modulus values obtained on three such fibers were 37.0, 38.9, and 35.9 ± 5.9 × $10^6$ psi.

EXAMPLE 6

Silicon nitride fibers have been grown from mixtures of silane and ammonia. The fiber diameters have ranged between 21 and 150 micrometers, at fiber growth velocities of between 60 and 740 micrometers per second. The ambient pressures within the reactant chamber varied between 0.45 and 1.3 atmospheres. The values of (U)·(D) were on the order of 22,000 micrometers squared per second with laser energy consumptions as small as 8 kilowatt hours per pound. Silicon nitride fibers grew at a negligible rate below and at diffusion limited rates above the melting point of silicon.

Fibers grown at small $NH_3:SiH_4$ ratios were black, produced the XRD pattern of polycrystalline silicon, and appeared to be dense. Density decreased and the fiber color changed with increasing $NH_3:SiH_4$ ratio from black to grey to a creamy white color. The white material was very fragile and XRD amorphous. SEM images showed that these fibers were composed of a collection of curved whiskerlike particles whose diameters were < 1 um and length to diameter ratios approximately 10.

Typical conditions for growth of these fibers are given below:

| Conditions For Fiber Growth From Silane And Ammonia | | | | | |
|---|---|---|---|---|---|
| $SiH_4:NH_3$ | Pressure PSIG | Laser Power mw | Growth Velocity um/s | Fiber Diam. um | Color |
| 2.3 | 4.2 | 56 | 496 | 36 | Black |
| 3.8 | 4.2 | 66 | 403 | 30 | Grey |
| 7.0 | 4.2 | 102 | 400 | 36 | Creamy White |

EXAMPLE 7

Figure 9:
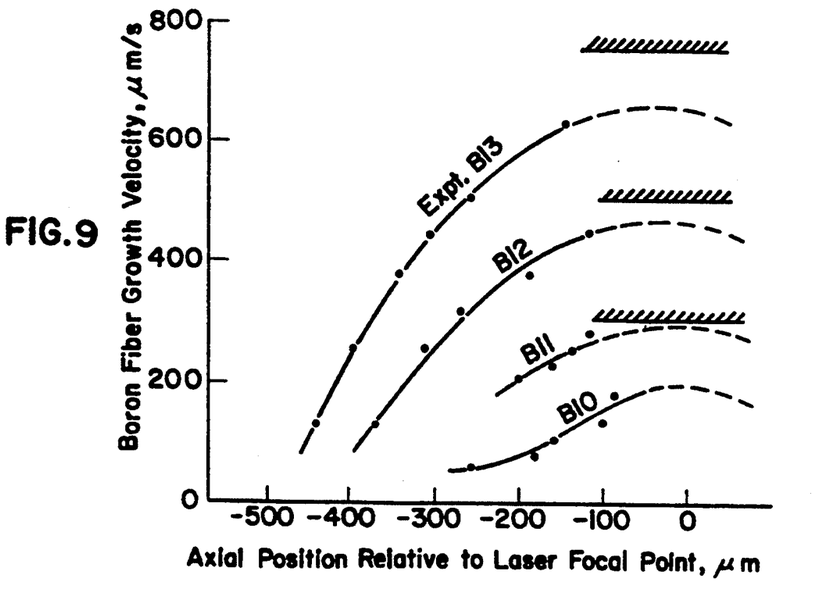
FIG. 9 is a graph illustrating the typical variation of boron fiber growth rate with distance from the laser focal point.

FIG. 9 presents typical results that illustrate the variation of boron fiber growth velocity with distance from the laser focal point, at constant laser power and ambient conditions. For these experiments, the reactant gas was a mixture of 40% diborane and 60% hydrogen at a pressure of 2.7 atmospheres. Values of the laser power for experiments B10 to B13 were 63, 70, 80 and 94 milliwatts, respectively.

EXAMPLE 8

Carbon fibers were grown from methane at a laser power of approximately one watt to obtain the following results:

| Methane Pressure p, atm | Growth Rate u, um/s | Fiber Diameter d, um | Smoke Formed? | u · d $um^2/s$ | d · p um · atm |
|---|---|---|---|---|---|
| 3.4 | 0 | | | 0 | |
| 3.7 | 41 | 107 | No | 4,400 | 398 |
| 4.1 | 162 | 86 | No | 14,000 | 349 |

-continued

| Methane Pressure p, atm | Growth Rate u, um/s | Fiber Diameter d, um | Smoke Formed? | u·d um²/s | d·p um·atm |
|---|---|---|---|---|---|
| 4.4 | 199 | 89 | Yes | 18,000 | 392 |
| 5.1 | 234 | 83 | Yes | 19,000 | 422 |
| 5.8 | 271 | 66 | Yes | 18,000 | 380 |
| 6.4 | 331 | 63 | Yes | 21,000 | 406 |

These results show that the threshold value of d·p for smoke formation is in the range 300 to 400 μm·atm. Also, the rapid increase of growth rate from a negligible to a nearly diffusion limited value, as the reactant pressure is increased from 3.4 to 4.5 atm illustrates the large effect of reactant internal energy on the rate of the gas/solid reaction. Diffusion limited growth results in a value of u·d equal to about $2 \times 10$ cm²/s, as illustrated by the nearly constant value of this property at pressures above 4.4 atm.

I claim:

1. A method of making pure fibers from a parent material, comprising the steps of:
   (a) placing a substrate in a gaseous environment wherein the gaseous environment includes the parent material in a gaseous form; and
   (b) heating the substrate with an emitted laser beam such that formation of a continuous, substrate free fiber growth is initiated and maintained, the fiber growth being supplied by accretions of the parent material from the gaseous environment.

2. The method of claim 1 wherein the gaseous environment and the substrate reside in a reaction chamber and the fiber growth process occurs within the reaction chamber, the reaction chamber permitting the pressurization of the gaseous environment to pressures above atmospheric if desired.

3. The method of claim 2, wherein the pressure is adjusted such that homogeneous decomposition of the reactant gas does not occur and fiber growth occurs at a maximum rate controlled by the external diffusion-limited supply of reactant to the fiber tip.

4. The method of claim 2 wherein said gaseous environment includes methane for the formation of carbon fibers.

5. The method of claim 2 wherein said gaseous environment includes ethylene for the formation of carbon fibers.

6. The method of claim 2 wherein said gaseous environment includes silane for the formation of silicon fibers.

7. The method of claim 2 wherein said gaseous environment includes silane and ethylene for the formation of silicon carbide fibers.

8. The method of claim 2 wherein said gaseous environment includes diborane and hydrogen for the formation of boron fibers.

9. The method of claim 2 wherein said gaseous environment includes silane and ammonia for the formation of silicon nitride fibers.

10. The method of claim 2 wherein said gaseous environment includes silane and methane for the formation of silicon carbide fibers.

11. The method of claim 2 wherein said gaseous environment includes dimethylzinc and hydrogen selenide for the formation of zinc selenide fibers.

12. The method of claim 2 wherein said gaseous environment includes germane and hydrogen for the formation of germanium fibers.

13. The method of claim 2 wherein said gaseous environment includes germanium tetrachloride and hydrogen for the formation of germanium fibers.

14. The method of claim 1 wherein the emitted laser beam has a focal pint adjusted to coincide with the tip of the growing fiber, the focal point of the laser creating a region of elevated temperatures at the fiber tip.

15. The method of claim 14 wherein a single crystal fiber is grown by use of a laser beam power sufficient to maintain a liquid tip on the growing fiber.

16. The method of claim 14, wherein a single crystal fiber is grown from a gas stream that carries small solid particles of the fiber material to the liquid fiber tip.

17. The method of claim 14 where said growing fiber is pulled such that said fiber tip resides within said focal point of said laser beam thereby resulting in automatic rate control near said laser focal point where the fiber growth rate equals the fiber pulling rate.

18. The method of claim 14 wherein the focal region is translated in a direction relative to the substrate such that fiber growth is along an axis defined by the direction of the translational movement.

19. The method of claim 18 wherein the substrate is composed of a material having low thermal conductivity such that fiber growth may be initiated in a region having a heat flux density substantially equal to the heat flux density required to sustain fiber growth.

20. The method of claim 19 wherein the growth of fibers is initiated when an edge of said substrate approaches said laser focal point.

21. The method of claim 19, wherein the substrate is composed substantially of paper, the paper being carbonized by heating in an environment of hydrocarbon gases, thereby producing a substrate having relatively low thermal conductivity.

22. The method of claim 21, wherein the growth of fibers is initiated and continued by translating the fiber substrate through the focal regions of the laser beams at a constant rate while maintaining the power delivered by the laser beams constant.

23. The method of claim 18, wherein the tip of the growing fiber is located in a region where the laser beam is converging to a focal point and thereby achieves a growth rate equal to the rate at which the focal region is translated relative to the fiber substrate.

24. The method of claim 23, wherein a larger number of fibers are grown at equal rates from a single substrate near the focal points of a number of focused laser beams equal to the number of growing fibers.

25. The method of claim 24, wherein the growth of fibers is initiated and continued by translating the fiber substrate through the focal regions of the laser beams at a constant rate while maintaining the power delivered by the laser beams constant.

26. A method of producing a ribbon, comprising the steps of:
   (a) placing a substrate in a gaseous environment, the gaseous environment containing some proportion of the parent material;
   (b) introducing an emitted laser beam into the gaseous environment;
   (c) focusing the emitted laser beam to a relatively small region, the region thereby encountering relatively elevated temperatures as compared to the remainder of the gaseous environment, the region being so positioned as to intercept the substrate, thereby causing the initiation of the formation of a continuous, substrate free fiber from the gaseous environment onto the substrate;

(d) translating the region in an oscillatory motion thereby causing the accretion of a ribbon having a width corresponding to a distance traveled by the region during one half cycle of the oscillatory motion; and (e) simultaneously translating the region in a continuous direction and at a velocity substantially less than the oscillatory motion, the translation in a continuous direction defining the longitudinal axis of the ribbon.

27. A method of producing a ribbon, comprising the steps of:

(a) placing a substrate possessing relatively low thermal conductivity in a gaseous environment, the gaseous environment including some proportion of the parent material;

(b) introducing an emitted laser beam into the gaseous environment;

(c) passing the emitted laser light through a cylindrical lens, the cylindrical lens creating a region of elevated temperature, the region being characterized as a thin longitudinal area having a length;

(d) focusing the longitudinal region so as to intercept the substrate, thereby initiating an accretion of the parent material from the gaseous state onto the substrate, the ribbon having a width corresponding to the length of the longitudinal region; and (e) translating the region of elevated temperatures in a continuous direction, the continuous direction defining the longitudinal axis of the ribbon produced.

* * * * *